(12) United States Patent
Chang

(10) Patent No.: US 7,777,307 B2
(45) Date of Patent: Aug. 17, 2010

(54) HIGH-FREQUENCY SIGNAL TRANSMISSION CIRCUIT DEVICE

(75) Inventor: KueiSung Chang, Tokyo (JP)

(73) Assignee: Sony Corporation, Tokyo (JP)

( * ) Notice: Subject to any disclaimer, the term of this patent is extended or adjusted under 35 U.S.C. 154(b) by 327 days.

(21) Appl. No.: 11/409,567

(22) Filed: Apr. 24, 2006

(65) Prior Publication Data
US 2006/0270178 A1 Nov. 30, 2006

(30) Foreign Application Priority Data
Feb. 9, 2005 (JP) ............................. 2005-032701

(51) Int. Cl.
*H01L 39/00* (2006.01)
(52) U.S. Cl. ........................ 257/664; 257/259; 257/275; 257/277; 257/278; 257/728
(58) Field of Classification Search .................. 257/259, 257/275, 277, 278, 664, 728
See application file for complete search history.

(56) References Cited

U.S. PATENT DOCUMENTS

| 4,379,307 | A | * | 4/1983 | Soclof | .......................... 257/664 |
| 4,992,764 | A | * | 2/1991 | Ayasli | .......................... 333/247 |
| 5,521,406 | A | * | 5/1996 | Tserng et al. | .......................... 257/276 |
| 5,528,074 | A | * | 6/1996 | Goto et al. | .......................... 257/664 |
| 5,990,768 | A | * | 11/1999 | Takahashi et al. | ................. 333/247 |
| 6,307,450 | B2 | * | 10/2001 | Takahashi et al. | ................. 333/204 |
| 6,434,726 | B1 | * | 8/2002 | Goossen | .......................... 716/5 |
| 7,178,905 | B2 | * | 2/2007 | Shin et al. | .......................... 347/65 |
| 7,208,338 | B2 | * | 4/2007 | Chiba et al. | .......................... 438/45 |
| 7,294,280 | B2 | * | 11/2007 | Sherrer et al. | .......................... 216/24 |

* cited by examiner

*Primary Examiner*—Kevin M Picardat
*Assistant Examiner*—Bac H Au
(74) *Attorney, Agent, or Firm*—Wolf, Greenfield & Sacks, P.C.

(57) ABSTRACT

A method for manufacturing a high-frequency signal transmission circuit includes the steps of forming a groove to surround a first region on a semiconductor substrate, filling the groove with a stopper material, forming a high-frequency transmission line on the semiconductor substrate so that the transmission line extends over the first region, and etching the first region of the semiconductor substrate using the stopper material as an etching stopper to form a recess in the first region.

24 Claims, 7 Drawing Sheets

HIGH-FREQUENCY SIGNAL TRANSMISSION CIRCUIT DEVICE

CROSS REFERENCES TO RELATED APPLICATIONS

The present invention contains subject matter related to Japanese Patent Application JP 2005-032701 filed in the Japanese Patent Office on Feb. 9, 2005, the entire contents of which are incorporated herein by reference.

BACKGROUND OF THE INVENTION

1. Field of the Invention

The present invention relates to a method for manufacturing a high-frequency signal transmission circuit for transmitting high-frequency signals and a high-frequency signal transmission circuit device.

2. Description of the Related Art

Routers and the like used for cellular phones and wireless LAN (Local Area Network) have transmission circuits for high-frequency signals, such as switch circuits for high-frequency radio and the like, for transmitting and receiving signals. Types of transmission circuits include a microstrip type in which a coaxial line is extended to a plate form, a coplanar waveguide type in which a signal line and a ground line are provided on the same plane, and the like.

In recent years, it has been desired to integrate amplifiers and signal processing IC (Integrated Circuit), for minimizing the power losses of transmitted signals. Such integration is achieved using a semiconductor substrate, such as a silicon substrate, a GaAs substrate, or the like. However, the use of such a substrate increases the dielectric losses of transmission lines. Therefore, there has been proposed a transmission circuit having a hollow structure in which a hollow portion is formed in a semiconductor around a transmission line to decrease the dielectric constant and decrease the dielectric loss (refer to, for example, U.S. Pat. No. 5,986,517 (FIGS. 5A and 5B)).

Although not directly related to the invention, Japanese Unexamined Patent Application Publication No. 2000-286430 (FIG. 3, etc.) is given as a prior document of the invention. The device described in this document is an acceleration sensor.

SUMMARY OF THE INVENTION

However, the above-described transmission circuit having a hollow structure has the problem of causing difficulty in controlling the dimensional precision of the hollow portion and easily producing a dimensional error in the manufacturing process. Although the dielectric loss may be decreased by forming the hollow portion, a reflection loss is increased by mismatch between characteristic impedances at a boundary between the hollow portion and the other portion of the substrate.

Accordingly, it is desirable to provide a method for manufacturing a high-frequency signal transmission circuit and a high-frequency signal transmission circuit device which may be capable of integration while realizing a low dielectric loss and of decreasing a reflection loss.

According to an embodiment of the invention, a method for manufacturing a high-frequency signal transmission circuit includes the steps of forming a groove to surround a first region on a semiconductor substrate, filling the groove with a stopper material, forming a high-frequency transmission line on the semiconductor substrate so that the transmission line extends over the first region, and etching the first region of the semiconductor substrate using the stopper material as an etching stopper to form a recess in the first region after the formation of the transmission line.

According to an embodiment of the invention, the groove is filled with the stopper material used as the etching stopper so that the recess is formed with a distinct boundary between the first region and the other region on the substrate. Namely, the dimensional error of the recess may be decreased, thereby matching characteristic impedances and decreasing a reflection loss. Also, a hollow structure including the recess is formed to permit integration of, for example, an amplifier and a signal processing IC, while realizing a low dielectric loss.

According to an embodiment of the invention, a high-frequency signal is a signal having, for example, a frequency in the band of several hundreds MHz to several hundreds GHz, and includes so-called microwaves and milliwaves.

The stopper material may be a conductor, such as a metal or the like, or an insulator, such as an oxide film, a resin film, or the like.

The shape of the recess may be any shape. Examples of the shape (the shape of a plane constituting the recess) include a flat plane, a curved plane, and a combination of both planes. The shape of the recess as viewed from the surface side of the semiconductor substrate, i.e., the shape of the boundary between the first region and the other region on the substrate, may be formed by a straight line, a curved line, or a combination of both lines.

According to an embodiment of the invention, the step of forming the recess includes the steps of forming slits in an insulating film along the boundary between the first region and a second region of the semiconductor substrate, which is other than the first region, and etching the first region after the slits are formed in the insulating film. As a result, the recess is formed by etching along the boundary between the first region and the second region, i.e., formed with no dimensional error. The slits are not limited to linear slits and may be dotted or perforated slits. The slits are formed by, for example, photolithography and etching.

According to an embodiment of the invention, the method further includes the step of forming an insulating film on the semiconductor substrate in which the groove has been formed, and the step of forming the insulating film includes the step of filling the groove with a material of the insulating film serving as the stopper material. As a result, the groove is filled with the stopper material during the formation of the insulating film, thereby decreasing the process time, as compared with, for example, a case in which an insulating film and a stopper material are formed in respective processes. In this case, the step of forming the recess may include the steps of forming slits in the insulating film along the boundary between the first region and a second region of the substrate, which is other than the first region; and etching the first region after the slits are formed in the insulating film.

According to an embodiment of the invention, when the stopper material is a conductor, the method further includes the step of forming an insulating film on the semiconductor substrate between the step of filling the groove with the conductor serving as the stopper material and the step of forming the transmission line.

According to an embodiment of the invention, the step of forming the recess includes the steps of forming slits in at least the insulating film along the boundary between the first region and a second region of the substrate, which is other than the first region, after the insulating film is formed; and etching the first region after the slits are formed in the insulating film.

According to an embodiment of the invention, the method further includes the step of forming a conductor film on the semiconductor substrate in which the groove has been formed, and the step of forming the conductor film includes the step of filling the groove with a material of the conductor film. As a result, the groove may be filled with the stopper material during the formation of the conductor film, thereby decreasing the process time, as compared with, for example, a case in which a conductor film and a stopper material are formed in respective processes. In this case, the conductor film remains above the recess and below the transmission line after the formation of the recess, and thus the micro-shielding effect of the conductor film is expected. In other words, the stopper material and a shielding material are formed by one time of deposition of the conductor film.

According to an embodiment of the invention, the method further includes the step of forming a conductor to coat a surface of the recess formed by the etching. The thus-deposited conductor may produce the micro-shielding effect on the transmission line. The deposited conductor may be electrically connected to the stopper material. The surface of the recess refers to a surface constituting the recess, which is other than the surfaces on which the stopper material is formed. The material of the conductor may be the same as or different from that of the conductor used as the stopper material formed in the groove. The conductor may be deposited by a method, for example, electroless plating or the like, but the method is not limited to this.

According to an embodiment of the invention, the step of forming the groove includes the steps of forming a first groove to surround the first region, and forming a second groove near the portion where the first groove is formed. According to an embodiment of the invention, the step of filling the grooves with the stopper material includes the step of filling the first groove with the stopper material composed of a first material, and the method for manufacturing a high-frequency signal transmission circuit device further includes the step of filling the second groove with a second material different from the first material. For example, when the first material is an insulating material, for example, a conductive material is used as the second material. The conductive material may produce the micro-shielding effect.

According to an embodiment of the invention, the step of filling the groove with the stopper material includes the steps of forming a first film composed of a first material at least in the groove, and forming a second film composed of a second material on the first film at least in the groove after the first film is formed, the second material being different from the first material. In this way, the groove may be filled with at least two materials. In this case, for example, when the first material is a conductive material, an insulating material may be used as the second material, or vice versa. As a result, the micro-shielding effect as well as the stopper effect may be obtained.

According to an embodiment of the invention, the step of forming the transmission line includes the steps of forming a first portion having a first width of the transmission line on the first region, and forming a second portion having a second width on a second region other than the first region of the semiconductor substrate, the second width being different from the first width of the transmission line. The first and second widths may be determined so as to match the characteristics impedances of the first and second portions.

According to an embodiment of the invention, the step of forming the recess includes the step of controlling the depth of the recess. Therefore, the capacitance of the transmission line may be determined according to the depth of the recess, thereby precisely matching the characteristic impedances at the boundary. Specifically, for example, in designing a high-frequency signal transmission circuit, a designer determines the depth of the recess by calculating the capacitance. Therefore, the recess may be formed to the depth previously determined.

According to an embodiment of the invention, the step of controlling the depth of the recess includes the steps of measuring the characteristic impedance of the transmission line, and controlling the depth according to the measurement result. Specifically, in actually manufacturing a product, the depth may be controlled using, for example, one sample for each lot, for satisfactorily matching the characteristic impedances. In this case, for example, the depth may be increased stepwise, and the characteristic impedance may be measured in each step. On the other hand, in a related art manufacturing method in which a recess is formed from the back of a substrate, the substrate is removed to a depth corresponding to the thickness thereof to form the recess, and thus the depth of the recess is determined by the thickness of the substrate. Therefore, the related art method is difficult to compensate for a variation in characteristic impedance.

The above-described steps may be performed in any desired order unless otherwise specified in the description of the features or the operation and advantage of the invention.

According to an embodiment of the invention, a high-frequency signal transmission circuit device includes a semiconductor substrate having a recess on a surface thereof, the recess having side surfaces; a stopper material formed on at least the side surfaces and serving as an etching stopper in forming the recess by etching; and a high-frequency signal transmission line provided on the semiconductor substrate to extend over the recess.

According to an embodiment of the invention, a groove is filled with a stopper material serving as an etching stopper so that the recess is formed with a distinct boundary between a first region and the other region on the substrate. In other words, the dimensional error of the recess may be decreased to match characteristic impedances and decrease a reflection loss. In addition, of course, a hollow structure is formed by the recess, thereby permitting integration of an amplifier and signal processing IC while realizing a low dielectric loss. The side surfaces of the recess may be or may not be perpendicular to the surface of the semiconductor substrate, and the side surfaces may be planes, curved surfaces, or a combination thereof.

According to an embodiment of the invention, the stopper material is an insulator.

According to an embodiment of the invention, an insulating film is further provided on the semiconductor substrate, and the insulator used as the stopper material is a part of a material of the insulating film.

According to an embodiment of the invention, the stopper material is a conductor.

According to an embodiment of the invention, the high-frequency signal transmission circuit device further includes a conductor film provided below the transmission line so as to extend over the recess, and an insulating film provided between the transmission line and the conductor film.

According to an embodiment of the invention, the recess includes a surface other than the side surfaces and a conductor film provided on the surface.

According to an embodiment of the invention, the transmission line includes a first portion extending over the recess and having a first width and a second portion having a second width different from the first width, the second portion being disposed on a portion other than the recess of the semiconductor substrate.

According to an embodiment of the invention, the stopper material includes a first film composed of a first material and a second film formed on the first film and composed of a second material different from the first material.

According to an embodiment of the invention, it may be possible to achieve integration while realizing a low dielectric loss and decrease a reflection loss.

DESCRIPTION OF THE PREFERRED EMBODIMENTS

Embodiments of the present invention will be described on the basis of the drawings.

Figure 1:
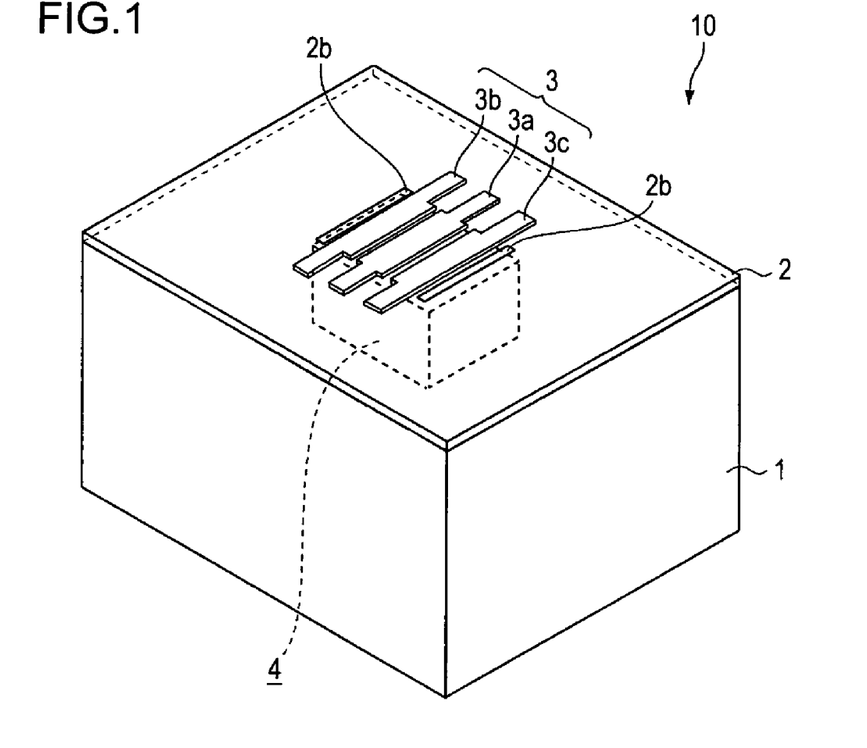
FIG. 1 is a perspective view showing a portion of a high-frequency signal transmission circuit device according to an embodiment of the present invention.
Figure 2:
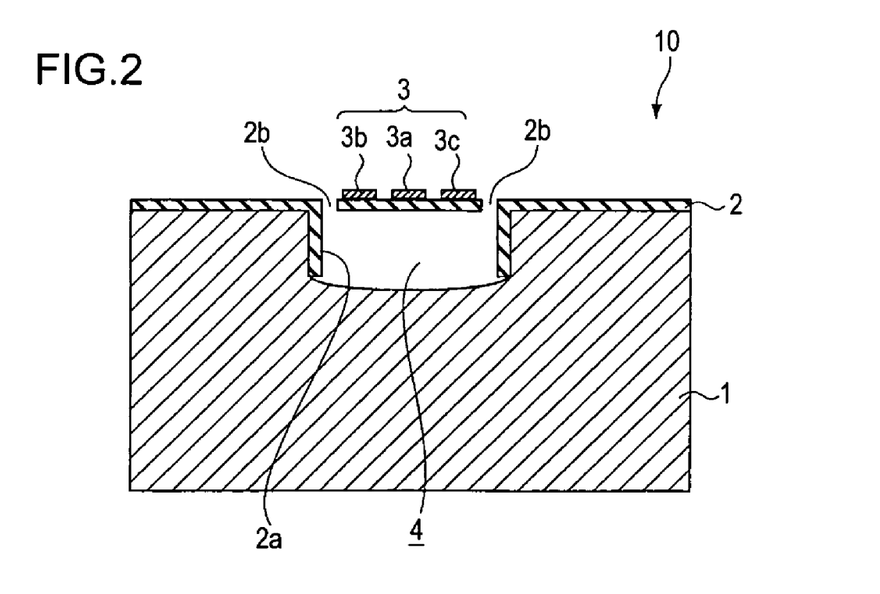
FIG. 2 is a sectional view of the circuit device shown in FIG. 1.

FIG. 1 is a perspective view showing a portion of a high-frequency signal transmission circuit device according to an embodiment of the invention. FIG. 2 is a sectional view of the same.

Referring to FIG. 1, a high-frequency signal transmission circuit device (simply referred to as a "circuit device" hereinafter) 10 includes a semiconductor substrate 1 and a transmission line 3 formed on the semiconductor substrate 1 with an insulating film 2 provided therebetween. In this embodiment, the circuit device 10 is, for example, a coplanar waveguide type circuit device in which the transmission line 3 includes a signal line 3a and ground lines 3b and 3c disposed on both sides of the signal line 3a. The semiconductor substrate 1 is composed of, for example, Si, GaAs, or the like. The insulating film 2 is composed of, for example, $SiO_2$, SiN, BCB (benzocyclobutene), or the like. The materials of the semiconductor substrate 1 and the insulating film 2 are not limited to these materials. Slits 2b will be described later.

In the semiconductor substrate 1, a substantially rectangular parallelepiped hollow potion 4 is provided below the transmission line 3. Namely, the transmission line 3 is formed on the substrate 1 to extend over the hollow portion 4. By providing the hollow portion 4, integration, for example, integration of an amplifier and signal processing IC, may be achieved while decreasing a dielectric loss of the transmission line 3 due to the semiconductor substrate.

In the hollow portion 4, i.e., the recess 4 provided in the semiconductor substrate 1, a stopper material 2a is provided on the side surfaces. The stopper material 2a is formed during forming the insulating film 2 on the substrate 1 as described below. The stopper material 2a is provided, for example, on the four side surfaces of the recess 4. By providing the stopper material 2a, the recess 4 may be formed by etching along the boundary between the region of the recess 4 and a region other than the recess 4 of the substrate 1 (simply referred to as "the boundary" hereinafter) with a decreased dimensional error, as described below. Since the dimensional error is decreased, characteristic impedances may be matched to decrease a reflection loss.

Figure 3:
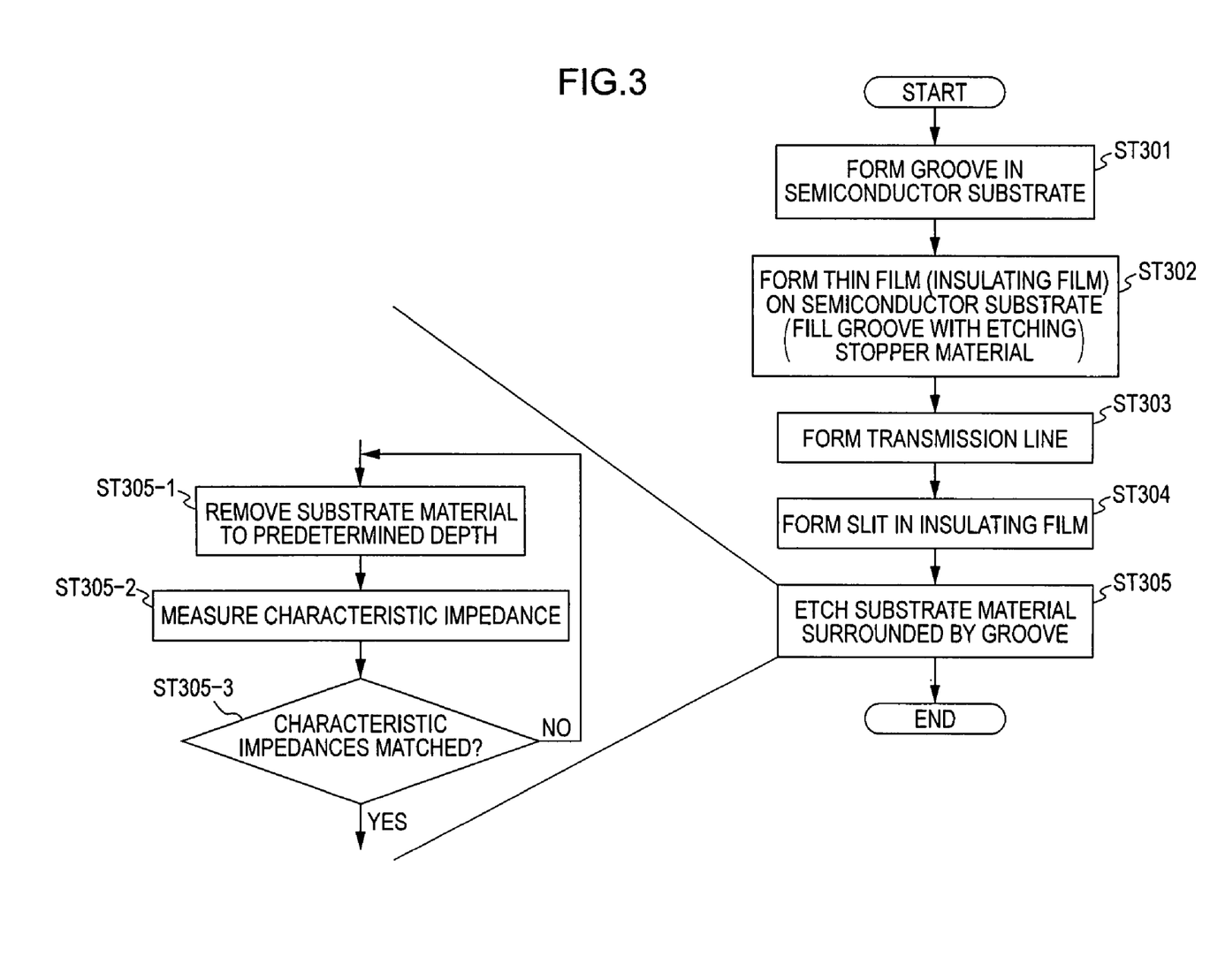
FIG. 3 is a flowchart showing a method for manufacturing the circuit device shown in FIGS. 1 and 2.

Next, a method for manufacturing the circuit device 10 will be described. FIG. 3 is a flowchart showing the manufacturing method.

Figure 4A:
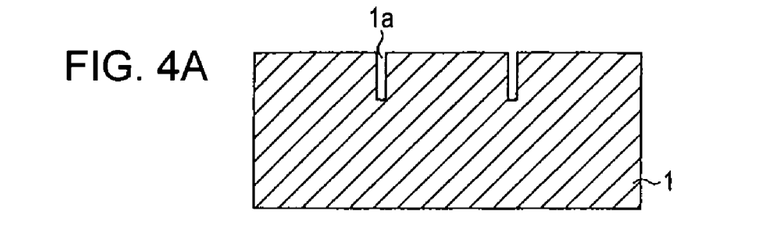
FIGS. 4A to 4E are sectional views showing respective steps of the method for manufacturing the circuit device shown in FIG. 3.

As shown in FIG. 4A, a groove 1a is formed in the semiconductor substrate 1 (step 301). The groove 1a is formed by photolithography and etching, the etching step being performed by, for example, dry etching. The depth of the groove 1a is determined to be substantially the same as the maximum depth of the recess 4 (refer to FIG. 4E). However, as described below, the depth of the groove 1a may slightly vary in the plane of the semiconductor substrate 1. The groove 1a is formed in, for example, a tetragonal shape, as viewed from the top of the substrate 1 so as to surround a region in which the recess 4 is to be formed.

Figure 4B:
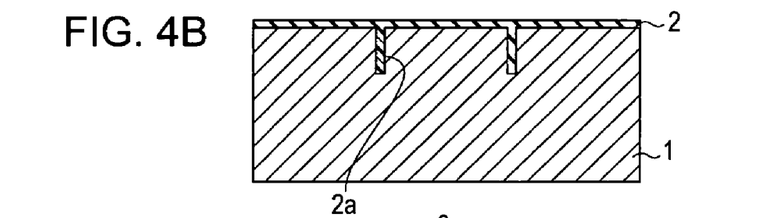

After the groove 1a is formed in the semiconductor substrate 1, a thin film (insulating film) 2 is formed on the substrate 1, as shown in FIG. 4B (step 302). The thin film 2 is deposited by a method such as spin coating, vapor deposition, or the like. In this step, the material of the thin film 2 is also deposited in the groove 1a. The thin film material deposited in the groove 1a servers as an etching stopper material 2a in a subsequent step (FIG. 4E).

Figure 4C:
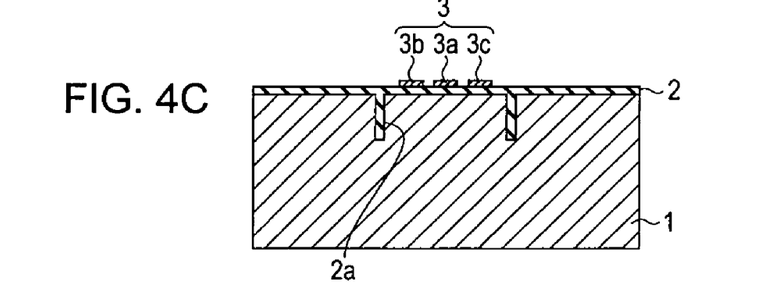

After the thin film 2 is formed on the semiconductor substrate 1, the transmission line 3 is formed on the thin film 2, as shown in FIG. 4C (step 303). Specifically, the transmission line 3 is formed by a method in which a conductor film (not shown in the drawing) used as a material of the transmission line is formed, followed by photolithography and etching, or another method. The line width of the transmission line 3 is designed and formed so that characteristic impedances at the boundary are matched with each other, as described below. A characteristic impedance $Z_0$ is represented by the following equation (1):

$$Z_0 = \{(R+j\omega L)/(G+j\omega C)\}^{1/2} \quad (1)$$

wherein R is resistance ($\omega$), L is inductance (H), G is conductance ($1/\omega$), and C is capacitance (F).

Figure 4D:
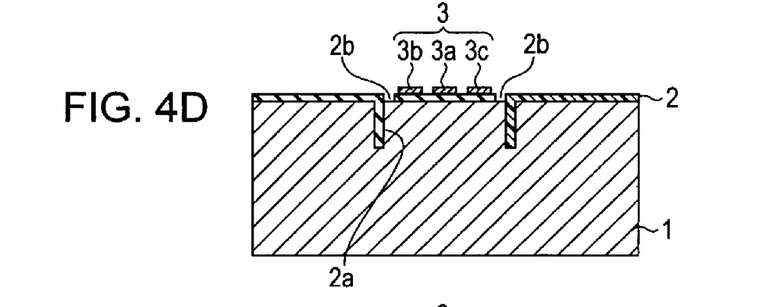
Figure 4E:
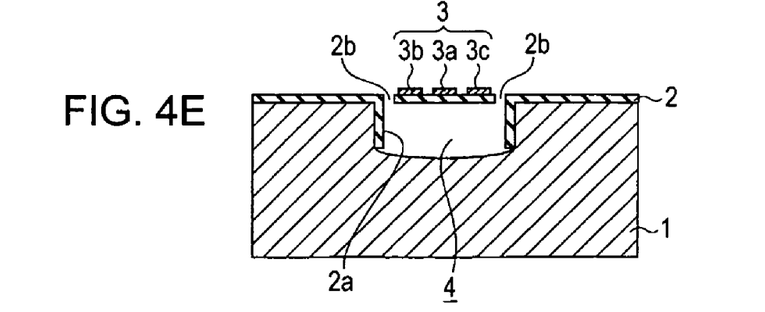

After the transmission line 3 is formed, the slits 2b are formed in the thin film 2 by, for example, photolithography and etching, as shown in FIG. 4D (step 304). For example, the two slits 2b are formed inward of the groove 1a (etching stopper 2a) along the substantially parallel two sides of the groove 1a (etching stopper 2a). In the etching step, for example, dry etching is performed. The slits 2b are provided for forming the recess (hollow portion) 4 in a next step.

Although, as described above, the two slits 2b are formed in substantially parallel, the form of the slits 2b is not limited to this, and the number and pattern of the slits 2b may be variously changed.

After the slits 2b are formed, the semiconductor substrate 1 and the etching stopper 2a are etched through the slits 2b with high selectivity, as shown in FIG. 4E (step 305). In the etching, dry etching, wet etching, or both the dry etching and the wet etching are performed. In the etching step, only the semiconductor substrate 1 is removed to form the recess 4 as the hollow portion.

Figure 5:
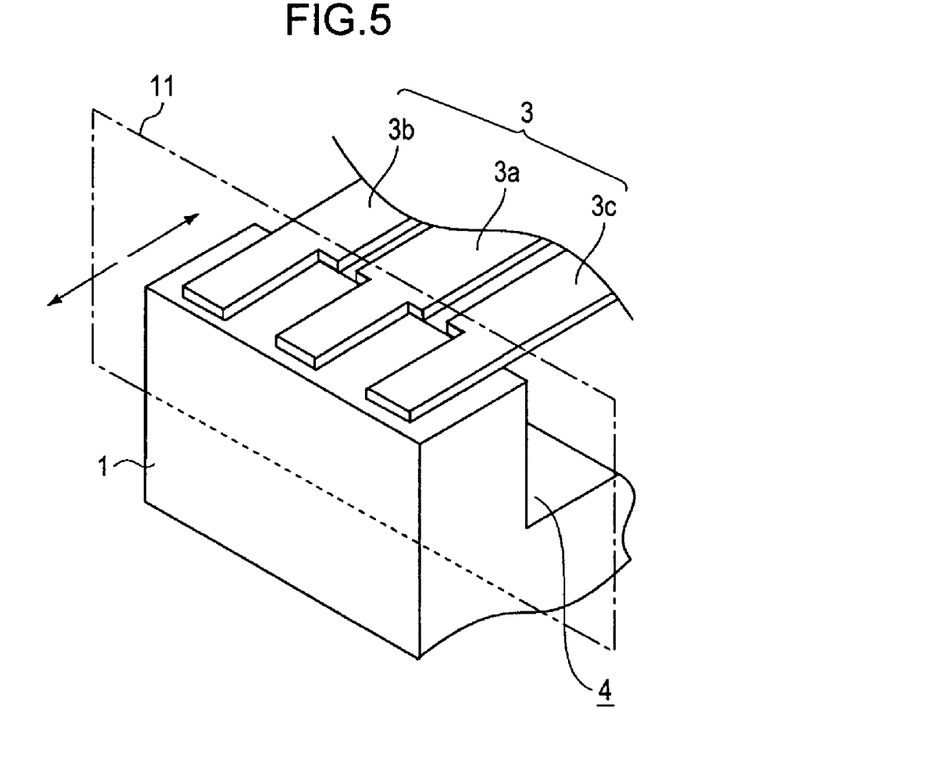
FIG. 5 is an enlarged perspective view showing a transmission line (coplanar waveguide type) near a boundary.
Figure 6:
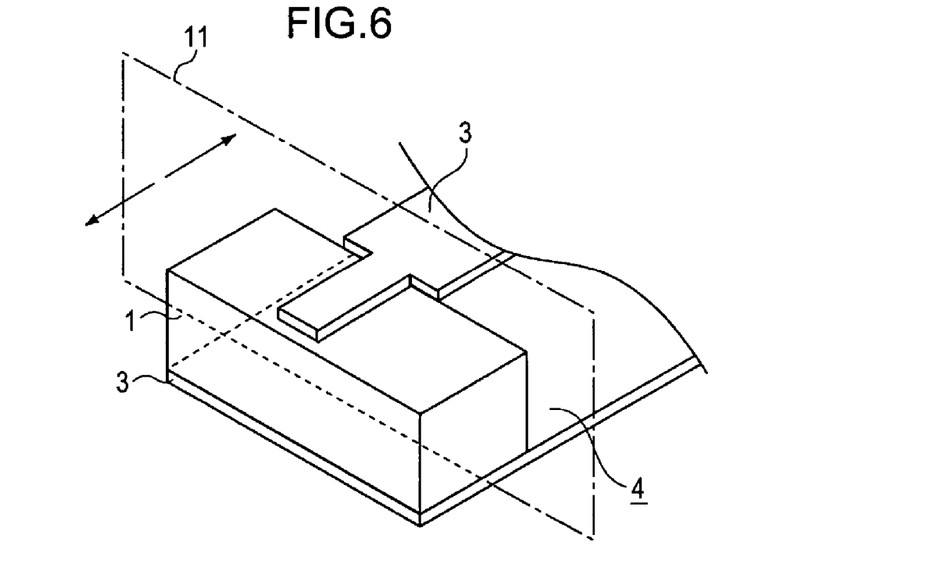
FIG. 6 is an enlarged perspective view showing a transmission line (micro-strip line type) near a boundary.

FIGS. 5 and 6 are each an enlarged perspective view of the transmission line 3 near the boundary. In particular, FIG. 5 shows a coplanar waveguide type according to this embodiment, and FIG. 6 shows a micro-strip type. As shown in these drawings, the line width of the transmission line 3 is designed and formed so that the characteristic impedances at the boundary 11 are matched with each other. In an example shown in each of FIGS. 5 and 6, the line width above the recess 4 is larger than that on a portion other than the recess 4 of the semiconductor substrate 1. In each of FIGS. 5 and 6, the insulating film is omitted.

The shape of the boundary is not limited to the linear shape shown in FIGS. 5 and 6, and the shape may be changed according to changes in the line width of the transmission line. In fact, as seen from equation (1), the boundary varies depending on the shape of the line. Namely, the shape of the recess may be changed depending on the dimensional design of the transmission line. For example, when a smoothly curved transmission line is desired, any boundary shape may be formed according to dimensional change in the transmission line. It is important that the hollow structure is accurately formed along the boundary determined according to the design.

As described above, in the method for manufacturing the circuit device 10 according to the embodiment, the groove 1a is filled with the stopper material 2a used as the etching stopper, and thus the recess is formed with a distinct boundary. Therefore, the dimensional error of the recess 4 may be decreased, and thus the characteristic impedances may be matched with each other to decrease a reflection loss.

In this embodiment, the groove 1a is filled with the stopper material 2a during forming the thin film 2, and thus the process time may be shortened, as compared with a case in which the thin film 2 and the stopper material 2a are formed in separate processes.

In this embodiment, the recess 4 with no dimension error may be formed by forming the slits 2b in the thin film 2 along the boundary and then etching the material of the semiconductor substrate.

Next, the inventors conducted simulation for characteristic impedance matching by forming the recesses 4 having different depths in the step 305 of forming the recess 4. The simulation will be described in further detail below.

Specifically, the material of the substrate 1 is first removed to a predetermined depth by, for example, etching (step 305-1). The predetermined depth is smaller than the predetermined final depth of the recess 4 and is, for example, 10 μm. After the substrate material is removed to the predetermined depth, the characteristic impedances on both sides of the boundary of the transmission line 3 are measured (step 305-2). As a result of measurement, when the characteristic impedances are matched or a difference between the characteristic impedances on both sides of the boundary is within a desired range, the formation of the recess is finished. When the characteristic impedances are not matched or a difference is not in the desired range, the step returns to step 305-1 in which the recess 4 is further deepened by etching.

The capacitance C between the transmission line 3 and the semiconductor substrate 1 is represented by the following equation (2):

$$C = (\varepsilon_r \varepsilon_0 \cdot S)/d \quad (2)$$

wherein $\varepsilon_r$ is the dielectric constant of air of 1, $\varepsilon_0$ is the dielectric constant of vacuum, S is the area of the transmission line facing the semiconductor substrate, and d is the depth of the recess.

Therefore, C varies with changes in d, and consequently the characteristic impedance also changes according to the equation (1). In other words, the characteristic impedance may be controlled by controlling the depth d.

As a result of the above-described simulation, the inventors achieved matching between the characteristic impedances, and consequently, an improvement of about 1 dB/cm was obtained. In the above-described simulation, the recess 4 was formed by 10 μm at each time. However, for example, when a variation of the depth is 10 μm, in the simulation, a variation of the characteristic impedances is only 0.1 to 0.2 dB/cm and thus has no problem. In this simulation, it is assumed that the line widths of the transmission line 3 on both sides of the boundary coincide with respective predetermined values.

As described above, the maximum depth of the recess is previously determined, and the recess 4 may be formed by gradually deepening the recess 4. Therefore, in step 301, the depth of the groove 1a (or the stopper material 2a) may slightly vary in the plane of the substrate 1. Namely, the etching rate may slightly vary in the plane of the substrate 1.

In an actual process for manufacturing a product, when the steps 305-1 to 305-3 are performed for each substrate, the process takes much time and cost. Therefore, in the actual process for manufacturing a product, processing in the steps 305-1 to 305-3 may not be performed. In other words, in designing a product, a designer may appropriately determine the depth of the recess 4 by calculation according to the equations (1) and (2), and the recess 4 may be formed to the predetermined depth.

However, in the actual process for manufacturing a product, for example, when processing in the steps 305-1 to 305-3 is performed using one sample for each lot, the depth may be finely controlled, thereby achieving more satisfactory matching between characteristic impedances.

Figure 7:
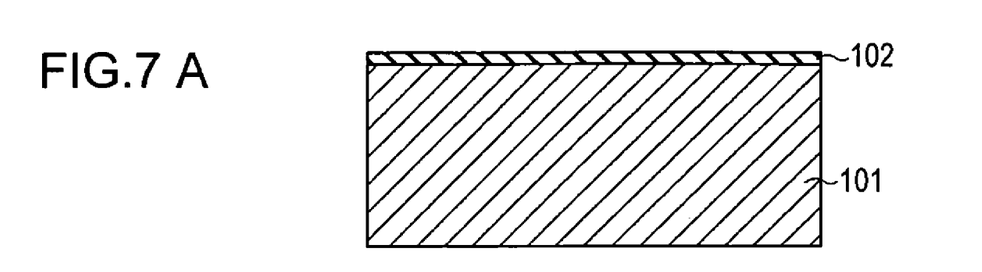
FIGS. 7A to 7D are sectional views showing respective steps of a related art method for manufacturing a hollow structure.
Figure 7C:
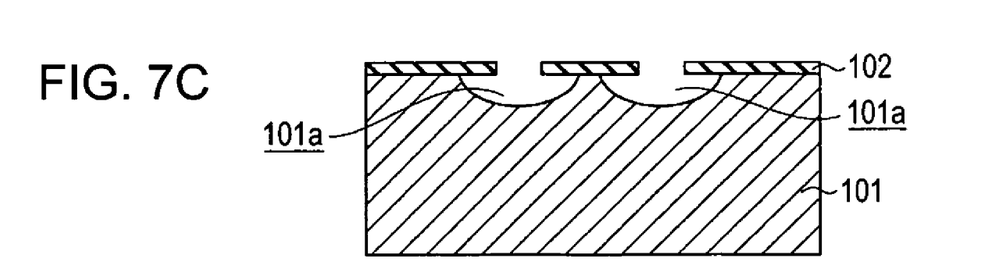
Figure 7D:
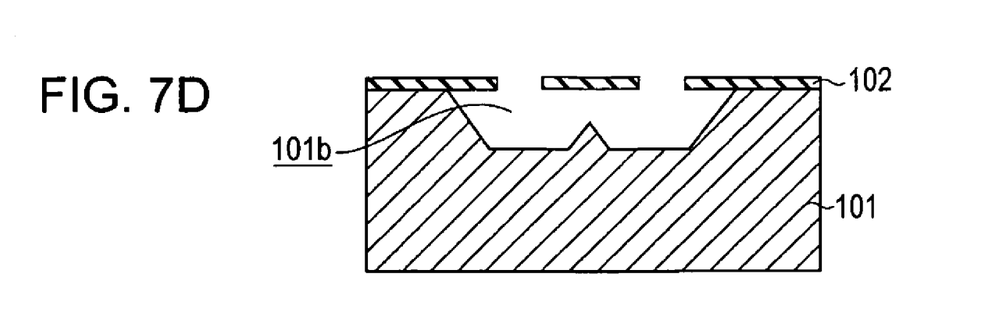

FIG. 7 is a drawing showing a related art method for forming a hollow structure. As shown in FIG. 7A, a thin film 102 of SiO$_2$ or the like is formed on a silicon substrate 101. Then, as shown in FIG. 7B, slits or holes 102b are formed in the thin film 102. Furthermore, as shown in FIG. 7C, the material of the substrate 101 is removed by isotropic etching (for example, reactive ion etching, XeF$_2$ gas etching, or the like) to form recesses 101a. Then, as shown in FIG. 7D, the substrate material is removed by anisotropic etching (for example, anisotropic alkali wet etching of crystal). As a result, the two recesses 101a are connected to form a recess 101b, thereby forming a hollow structure. Although a transmission line is formed between the step shown in FIG. 7A and the step shown in FIG. 7B, the transmission line is not shown in FIGS. 7A to 7D.

This related art method includes the two-step etching shown in FIGS. 7C and 7D, and thus the process is complicated, thereby causing the problem of lengthening the processing time. Also, the step shown in FIG. 7C includes isotropic etching, and thus it is difficult to control CD (Critical Dimension) due to variations in the etching rate in the plane of the substrate. Namely, there is also the problem of large dimensional errors of the recesses 101a and 101b. However, in the manufacturing method according to an embodiment of the invention, the use of the stopper material 2a may eliminate the need for the two-step process, thereby minimizing the dimensional error.

Figure 8:
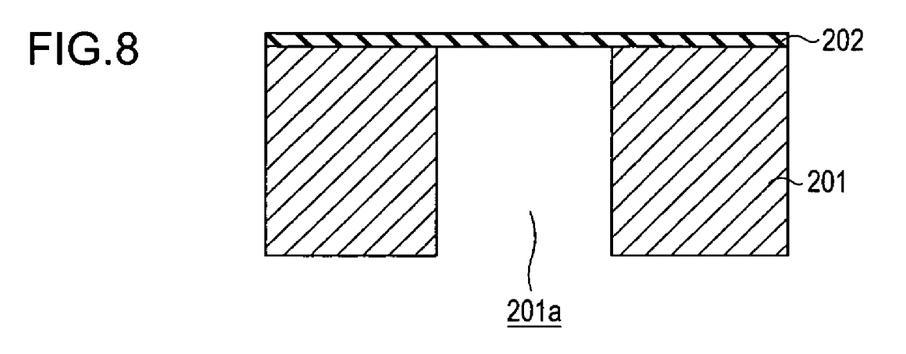
FIG. 8 is a sectional view showing another related art method for manufacturing a hollow structure.
Figure 9:
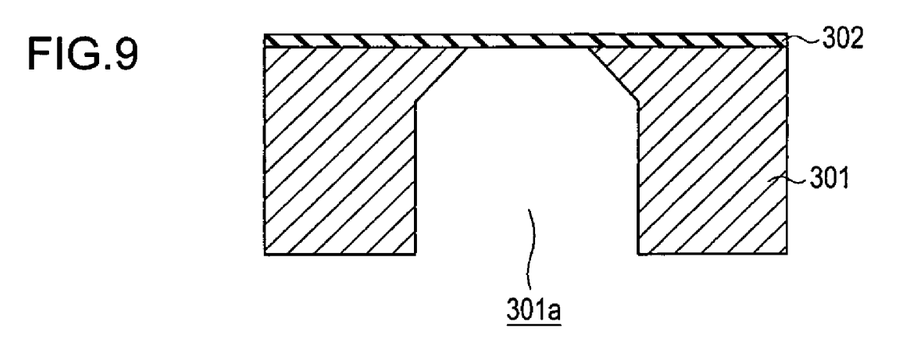
FIG. 9 is a sectional view showing still another related art method for manufacturing a hollow structure.
Figure 10:
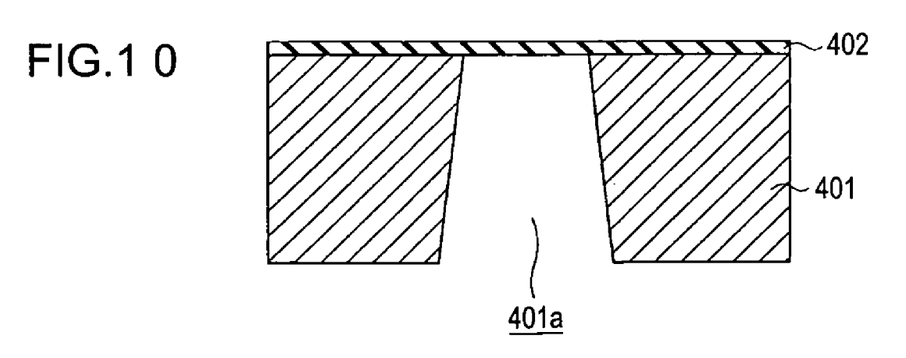
FIG. 10 is a sectional view showing a further related art method for manufacturing a hollow structure.

FIGS. 8, 9 and 10 are drawings each showing another related art method for forming a hollow structure. In the three forming methods, recesses 201a, 301a, 401a are formed by etching from the backs of substrates 201, 301, and 401, respectively. In particular, FIG. 8 shows the recess formed by reactive ion etching, FIG. 9 shows the recess formed by anisotropic alkali wet etching of crystal, and FIG. 10 shows the recess formed using both reactive ion etching and anisotropic alkali wet etching of crystal.

In common to the three methods, the substrate material is preferably removed from the back to the surface, thereby increasing the processing time and the production cost. In common to the three methods, also, transmission lines (not shown) are provided on thin films (insulating films) 202, 302, and 402, respectively. However, in this case, both-side alignment is preferably performed for the surface and the back of the substrate 201 or the like in forming the recess 201a or the like and in forming the transmission line. This has the problem of decreasing the alignment precision, as compared with one-side alignment.

In the reactive etching shown in FIG. 8, the etching rate varies in the plane of the substrate, thereby causing difficulty in estimating any etching end point in the entire plane of the substrate.

In the anisotropic alkali wet etching of crystal shown in FIG. 9, when $SiO_2$ is used as an example of the material of the thin film 302, it may be necessary that a $SiO_2$ film is thickly deposited, or a protective film is newly formed, thereby complicating the process.

Figure 11:
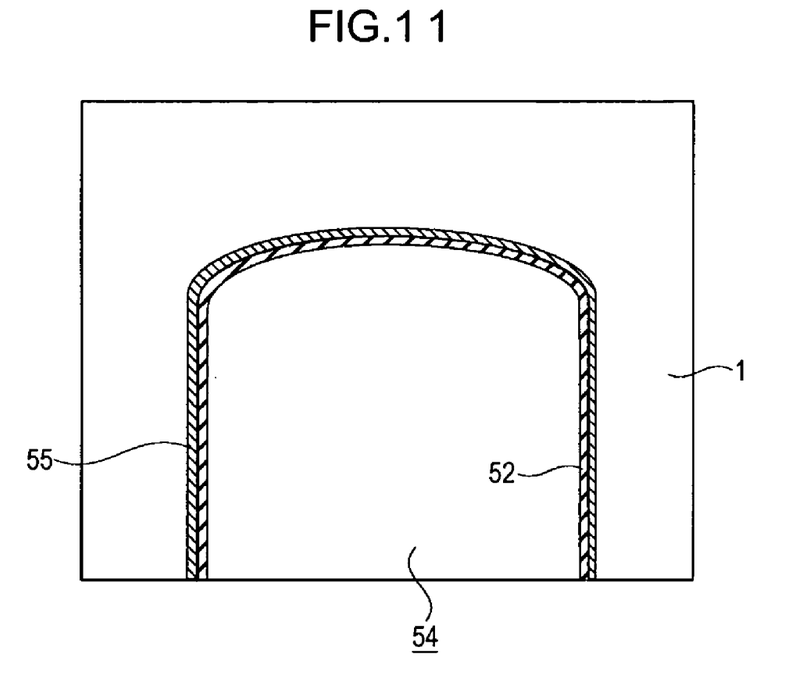
FIG. 11 is a plan view showing a portion of a substrate having a hollow structure according to another embodiment of the invention.

FIG. 11 is a plan view showing a portion of a substrate having a hollow structure according to another embodiment of the invention, as viewed from the surface side of a semiconductor substrate. In FIG. 11, a transmission line is omitted, and only a portion of a recess is shown.

In this embodiment, two types of films 52 and 55 are formed around a recess 54 of a semiconductor substrate 1. For example, the film 52 is an insulating film serving as a stopper material, and the film 55 is a conductor film. In this case, for example, when a groove (not shown) is previously formed in a portion where each of the films 52 and 55 is to be formed, the films 52 and 55 may be formed by filling the grooves with respective materials of the films 52 and 55. Specifically, the groove is formed in the portion where the film 52 is to be formed, and then the groove is filled with the material of the film 52. Then, the recess 54 is formed using the film 52 as a stopper material. After the recess 54 is formed, the other groove is formed in the portion where the film 55 is to be formed, and then the groove is filled with the material of the film 55. By forming the film 55, the micro-shielding effect may be obtained by a transmission line (not shown) extending over the recess 54. Each of the grooves may have any width, and a narrower groove has no influence on the boundary positional precision.

Although FIG. 11 shows a structure having the two grooves and the two films, the number of the grooves may be larger than 2, and, accordingly, the number of the films may be larger than 2. With respect to the formation order of the films 52 and 55, the film 52 may be formed after the formation of the film 55. Both the films 52 and 55 may be conductor films.

Figure 12:
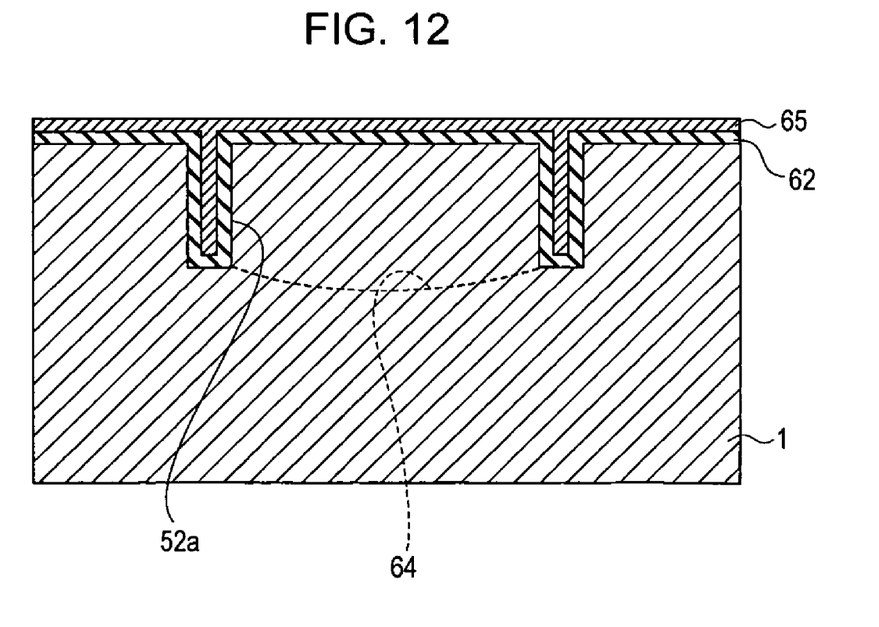
FIG. 12 is a sectional view showing a portion of a substrate having a hollow structure in the course of manufacture according to a further embodiment of the invention.

FIG. 12 is a sectional view showing a portion of a substrate having a hollow structure in the course of manufacture according to still another embodiment of the invention.

In this embodiment, a groove 52a is formed in a semiconductor substrate 1, and then, for example, an insulating film 62 and a conductor film 65 which are conformal to each other are formed. In this case, the width of the groove 52a may be larger than the width of the groove 1a shown in FIG. 4A, or the thickness of each of the insulating film 62 and the conductor film 65 may be smaller than that shown in FIG. 4B.

The embodiment shown in FIG. 12 will be described in further detail below. First, the groove 52a is filled with the insulating film 62. Since a space remains in the groove 52a after the groove 52a is filled with the insulating film 62, the groove 52a is filled with the conductor film 65 so that the remaining space is filled. Then, for example, as in FIGS. 4C to 4E, a transmission line (not shown) is formed, slits are formed in the conductor film 65 and the insulating film 62, and then a recess is formed by etching. However, of course, an insulating film is formed on the conductor film 65 before the transmission line is formed. The recess is formed as shown by reference numeral 64 in FIG. 12.

In this structure, the insulating film 62 or both the insulating film 62 and the conductor film 65 serve as an etching stopper material, and the conductor film 65 exhibits a shielding function like the effect described above with reference to FIG. 11.

Although FIG. 12 shows a total of two films including the insulating film 62 and the conductor film 65, the total number of the films may be 2 or more. In addition, the positions of the conductor film 65 and the insulating film 62 shown in FIG. 12 may be reversed. Namely, a conductor film may be first formed in the groove 52a, and then an insulating film may be formed on the conductor film in the remaining space of the groove 52a.

The present invention is not limited to the above-described embodiments, and various modifications may be made.

For example, FIG. 4B shows the case in which the stopper material 2a is formed in the groove 1a in the formation of the insulating film 2, but the insulating film 2 may be formed in a step other than the step of forming the stopper material 2a. Also, the insulating film 2 and the stopper material 2a may be formed using different materials.

Although, in FIGS. 4A to 4E, an insulating material is used as the stopper material 2a in the groove 1a, a conductor such as a metal or the like may be used instead of the insulating material. In this case, as a metal material, copper, aluminum, or the like is used. In addition, a conductor film may be first formed on the semiconductor substrate 1 to form a conductor in the groove 1a. Of course, the conductor may be formed only in the groove 1a.

When a conductor film is formed on the semiconductor substrate 1 using a conductor as a stopper material instead of the insulating film 2 shown in FIG. 4B, an insulating film is formed on the conductor film, and the transmission line 3 is formed on the insulating film. Then, as shown in FIG. 4D, slits are formed in the insulating film and the conductor film disposed below the insulating film. Then, as shown in FIG. 4E, the recess 4 is formed. In this case, the conductor film remaining directly below the transmission line 3 may exhibit the micro-shielding effect on the signal line 3a. Of course, the shielding material formed as described above is electrically connected to the ground lines 3b and 3c.

After the recess is formed after the conductive stopper material is formed, for example, a conductor film may be formed at the bottom of the recess 4 shown in FIG. 4E. In this structure, the micro-shielding effect on the signal line 3*a* may be obtained.

As the circuit device shown in FIGS. 1 and 2, a coplanar waveguide type is described above. However, the circuit device is not limited to this, and the circuit device may be a general micro-strip line type. Also, the pattern of the transmission line 3 is not limited to the linear pattern shown in FIGS. 1 and 2, and any line pattern may be used. Furthermore, as described above, the groove 1*a* and the hollow structure may be formed in any shapes according to the pattern, dimensions, and dimensional changes of the transmission line. For example, the shape and angle of the groove 1*a* are not limited to those described above, and, for example, the groove 1*a* may not be perpendicular to the surface of the semiconductor substrate.

Although the case using an insulating film material as the stopper material 2*a* in the groove 1*a* is described above, the stopper material 2*a* may not be necessarily the insulating film material and may be a conductor, such as a metal or the like. When a metal is used as the stopper material, the stopper material is deposited in a step other than a step of depositing an insulating film, and thus a two-step process is performed.

It should be understood by those skilled in the art that various modifications, combinations, sub-combinations and alterations may occur depending on design requirements and other factors insofar as they are within the scope of the appended claims or the equivalents thereof.

What is claimed is:

1. A high-frequency signal transmission circuit device comprising:
    a semiconductor substrate having a recess on a surface thereof, the recess having first and second side surfaces, the first and second side surfaces being spaced apart;
    an etching resistant stopper material having at least first and second portions, the first portion formed on the first side surface and the second portion formed on the second side surface, wherein the recess is formed by an etching process that removes a portion of the semiconductor substrate directly between the first and second portions of the etching resistant stopper material, and wherein the etching resistant stopper material is configured to protect the first and second side surfaces from the etching process; and
    a high-frequency signal transmission line provided on the semiconductor substrate, the signal transmission line having a first portion extending over the recess and a second portion not extending over the recess, the first portion having a first characteristic impedance and the second portion having a second characteristic impedance, wherein the first characteristic impedance is dependent upon a depth of the recess and wherein the depth of the recess is such that the first characteristic impedance and the second characteristic impedance are matched.

2. The high-frequency signal transmission circuit device according to claim 1, wherein the stopper material is an insulator.

3. The high-frequency signal transmission circuit device according to claim 2, further comprising an insulating film provided on the semiconductor substrate, wherein the insulator used as the stopper material is a part of a material of the insulating film.

4. The high-frequency signal transmission circuit device according to claim 1, wherein the stopper material is a conductor.

5. The high-frequency signal transmission circuit device according to claim 4, further comprising:
    a conductor film provided below the transmission line to extend over the recess; and
    an insulating film provided between the transmission line and the conductor film.

6. The high-frequency signal transmission circuit device according to claim 4, further comprising a conductor film formed between the first portion of the etching resistant stopper material and the first side surface.

7. The high-frequency signal transmission circuit device according to claim 1, wherein the first portion of the transmission line has a first width and the second portion of the transmission line has a second width smaller than the first width.

8. The high-frequency signal transmission circuit device according to claim 1, further comprising:
    a first film composed of a first material; and
    a second film formed on the first film and composed of a second material different from the first material.

9. The high-frequency signal transmission circuit device of claim 1, wherein the depth of the recess is such that a difference between the first and second characteristic impedances is no more than 0.2 dB/cm.

10. The high-frequency signal transmission circuit device of claim 9, wherein the depth of the recess is such that a difference between the first and second characteristic impedances is between 0.1 dB/cm and 0.2 dB/cm.

11. The high-frequency signal transmission circuit device of claim 1, wherein the depth of the recess is such that a difference between the first and second characteristic impedances is no more than 0.1 dB/cm.

12. A circuit device comprising:
    a substrate having a recess formed by an etching process comprising a first stage and a second stage, the recess having first and second side surfaces that are spaced apart;
    an etching resistant film having a first portion disposed adjacent to the first side surface of the recess and a second portion disposed adjacent to the second side surface of the recess, wherein the second stage of the etching process removes a portion of the substrate directly between the first and second portions of the etching resistant film, and wherein the etching resistant film is configured to protect the first and second side surfaces during the second stage of the etching process; and
    a circuit component formed on the substrate, the circuit component having a first portion extending over the recess and a second portion not extending over the recess, the first portion having a first characteristic impedance and the second portion having a second characteristic impedance, wherein the first characteristic impedance is dependent upon a depth of the recess and wherein the depth of the recess is such that the first characteristic impedance and the second characteristic impedance are matched.

13. The circuit device of claim 12, wherein the etching resistant film is formed at least partially by depositing an etching resistant material in a groove formed in the substrate during the first stage of the etching process.

14. The circuit device of claim 12, wherein the etching resistant film comprises an insulating material.

15. The circuit device of claim 12, further comprising an insulating film extending at least partially between the circuit component and the recess.

16. The circuit device of claim 15, wherein the etching resistant film is part of the insulating film.

17. The circuit device of claim 12, wherein the etching resistant film comprises a conductive material.

18. The circuit device of claim 12, further comprising an conductive film extending at least partially between the circuit component and the recess.

19. The circuit device of claim 18, wherein the circuit component is a signal transmission line, and wherein the conductive film provides a micro-shielding effect on the transmission line.

20. The circuit device of claim 12, wherein the circuit component is a signal transmission line, and wherein the first portion is wider than the second portion.

21. The circuit device of claim 12, wherein the circuit component is a signal transmission line, and wherein the depth of the recess is such that a difference between the first and second characteristic impedances is no more than 0.2 dB/cm.

22. The circuit device of claim 21, wherein the depth of the recess is such that a difference between the first and second characteristic impedances is between 0.1 dB/cm and 0.2 dB/cm.

23. The high-frequency signal transmission circuit device of claim 12, wherein the depth of the recess is such that a difference between the first and second characteristic impedances is no more than 0.1 dB/cm.

24. A high-frequency signal transmission circuit device comprising:
  a semiconductor substrate having a recess on a surface thereof, the recess having first and second side surfaces, the first and second side surfaces being spaced apart;
  an etching resistant stopper material having at least first and second portions, the first portion formed on the first side surface and the second portion formed on the second side surface, wherein the recess is formed by an etching process that removes a portion of the semiconductor substrate between the first and second portions of the etching resistant stopper material, and wherein the etching resistant stopper material is configured to protect the first and second side surfaces from the etching process; and
  a high-frequency signal transmission line provided on the semiconductor substrate, the signal transmission line having a first portion extending over the recess and a second portion not extending over the recess, the first portion being wider than the second portion.

* * * * *